(12) United States Patent
Bortolini et al.

(10) Patent No.: US 6,262,363 B1
(45) Date of Patent: Jul. 17, 2001

(54) ELECTROMAGNETIC SHIELDING METHOD AND APPARATUS

(75) Inventors: James R. Bortolini, Broomfield; Scott E. Farleigh, Denver, both of CO (US); Gary J. Grimes, Birmingham, AL (US); Charles J. Sherman, Westminster; Jean S. Nyquist, Denver, both of CO (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/224,601

(22) Filed: Dec. 31, 1998

(51) Int. Cl.[7] ........................................ H05K 9/00
(52) U.S. Cl. ................ 174/35 R; 361/816; 361/800; 361/752; 361/753
(58) Field of Search ................... 174/35 R, 51; 361/816, 800, 818, 752, 753

(56) References Cited

U.S. PATENT DOCUMENTS 5,774,344 * 6/1998 Casebolt .............................. 361/800

5,898,127 * 4/1999 Schuhmacher et al. ........... 174/35 R

* cited by examiner

Primary Examiner—Dean A. Reichard
Assistant Examiner—Hung V Ngo
(74) Attorney, Agent, or Firm—Maginot, Addison & Moore

(57) ABSTRACT

An arrangement for electromagnetically shielding a circuit carrying substrate includes first and second shielding members and a plurality of elastically deformable shielding connectors. The first shielding member has first and second dimensions exceeding first and second dimensions defined by the circuit and is disposed on a first side of the circuit. The second shielding member also has first and second dimensions exceeding first and second dimensions defined by the circuit and is disposed on a second side of the circuit. The first and second shielding members define at least one slot therebetween. Each of the plurality of shielding connectors is both plastically deformable and electrically conductive, and furthermore extends between the first shielding member and the second shielding member. The plurality of shielding connectors are disposed within and throughout said slot and spaced apart by a distance that is less than one-fourth the wavelength of an effective operating frequency of the circuit.

9 Claims, 7 Drawing Sheets

ELECTROMAGNETIC SHIELDING METHOD AND APPARATUS

FIELD OF THE INVENTION

The present invention relates generally to electronic circuits, and more particularly, to arrangements for electromagnetically shielding electronic circuits.

BACKGROUND OF THE INVENTION

The operation of electronic circuits, such as those within computers, telecommunications devices, and the like, causes electromagnetic radiation. Electromagnetic radiation consists of electromagnetic waves that propagate through the open atmosphere. Electromagnetic radiation from the operation of electronic circuits is undesirable because it can interfere with the performance of electronic systems, and can also interfere with radio broadcasts, cellular telephone signals, and other radio signals.

Electromagnetic (EM) radiation from electronic circuits, however, only causes undesirable interference to the extent that the EM energy radiates externally from the device containing the circuit. Accordingly, to control interference with communication signals, efforts are undertaken to inhibit the radiation of EM energy external to such devices. In fact, governmental agencies regulate the amount of external electromagnetic (EM) radiation that may be generated by such devices.

As a result, one element of product design for devices that include electronic circuits includes controlling external EM radiation, or in other words, containing the EM energy generated by the electronic circuit. One method of containing EM radiation is to provide EM shielding on the device. EM shielding typically consists of electrically conductive material that is grounded and acts as a barrier for the EM energy generated by the circuit. Proper shielding can substantially reduce the amount of harmful EM energy that is externally radiated by an electronic circuit. However, EM shielding increases the material and labor cost of products, and often dictates physical attributes and dimensions of the product.

In particular, it is noted that one of the most effective EM shielding arrangements consists of a complete skin of grounded material that completely encloses the electronic circuit. It has also been observed that a circuit may also be well-shielded by a grounded enclosure that has openings, as long as no opening has a dimension as large or larger than one-fourth the wavelength associated with the highest effective operating frequency of the circuit. Such a grounded enclosure is often referred to in the art as a Faraday cage. The phrase "effective operating frequency", as used herein, refers to a frequency of problematic radiation generated by the operation of the circuit. The effective operating frequency may be induced by the clock speed, for example, and may be a fraction or a multiple thereof.

Apart from EM radiation control, there are other constraints in electronic circuit design that can require an electronic circuit to be enclosed. For example, a circuit may require liquid cooling, and thus require a fluid tight enclosure. Yet other circuits may require an enclosure to provide physical isolation from a harsh operating environment. Still other circuits may require an enclosure to segregate heat tolerant electronic components from heat sensitive electronic components or vice versa.

It is noted, however, that enclosures required for such other constraints have different requirements than enclosures utilized for EM shielding. In particular, physical enclosures require some facility for placing the circuit, which is usually affixed to one or more circuit carry substrates, for example a printed circuit board, into the enclosure. In order for the enclosure to allow placement of the circuit into the enclosure, it must typically have a significant opening. The opening provides a path through which electromagnetic radiation may escape. Thus, enclosures required for physical constraints often are inadequate to also serve as the EM shielding of a circuit, particularly for circuits radiating high frequencies in which the wavelength is on the order of centimeters or less.

One prior art method of enclosing a circuit and providing EM shielding included placing the circuit within a grounded enclosure with a door. Surrounding the door are a plurality of spaced apart springs that provide electrical contact between the door and rest of the enclosure. The springs are electrically conductive and elastically deformable. The springs are spaced to prevent emission of radiation at wavelengths of interest. Springs are used instead of other structures because the elasticity of the springs adjusts to accommodate uneven spacing tolerances between the enclosure and the door, thereby ensuring that each spring is in electrical contact with both the door and the enclosure.

A problem associated with the above described enclosure is the labor and material cost associated with the use of springs. The spring material itself adds significantly to the cost of the enclosure. Moreover, the labor required to affix the springs to the enclosure, which is typically done by hand, is substantial. Furthermore, the springs are delicate and prone to damage.

Accordingly, there is a need for an arrangement of electromagnetically shielding an electronic circuit that incorporates a circuit enclosure that avoids the manufacturing costs associated with the use of an enclosure having spaced apart springs. There is a further need for an arrangement for electromagnetically shielding an electronic circuit that incorporates a circuit enclosure that fulfills a separate physical isolation requirement of the electronic circuit. There is further a need for a method of manufacturing such a device that is cost-effective.

SUMMARY OF THE INVENTION

The present invention fulfills the above needs, as well as others, by providing a circuit enclosure that defines a slot and further providing a plurality of plastically deformable shielding connectors that extend through the slot, wherein the shielding connectors are spaced apart by a distance that is less than one-fourth the wavelength of an effective operating frequency of the circuit. The use of the plastically deformable shielding connectors reduces the manufacturing cost of the enclosure by eliminating the need for springs. For example, solder rivets may be used as the plastically deformable shielding connectors. Solder rivets are not only relatively inexpensive, but also require less labor-intensive manufacturing operations and are less prone to damage. The use of plastically deformable shielding conductors nevertheless allows the opposing surfaces of the circuit enclosure to contact all of the shielding conductors even if the opposing surfaces are uneven due to spacing tolerances.

An exemplary embodiment of the present invention includes an arrangement for electromagnetically shielding a circuit carrying substrate, the circuit carrying substrate carrying a circuit comprising a plurality of separately mounted circuit elements. The arrangement includes first and second shielding members and a plurality of elastically deformable shielding connectors. The first shielding member has first and second dimensions exceeding first and second dimensions defined by the circuit and is disposed on a first side of the circuit. The second shielding member also has first and second dimensions exceeding first and second dimensions defined by the circuit and is disposed on a second side of the circuit. The first and second shielding members define at least one slot therebetween. Each of the plurality of shielding connectors is both plastically deformable and electrically conductive, and furthermore extends between the first shielding member and the second shielding member. The plurality of shielding connectors are disposed within and throughout said slot and spaced apart by a distance that is less than one-fourth the wavelength of an effective operating frequency of the circuit.

Typically, the first and second shielding members are secured to each other such that some of the shielding conductors plastically deform to allow the other shielding conductors to make electrical contact with both shielding members. Such plastic deformation allows for spacing tolerances between the first and second shielding members. Preferably, once the first and second shielding members are secured to each other, all of the shielding conductors are in electrical contact with both shielding members.

Optionally, the shielding connectors may include solder rivets, which facilitate ease of manufacture. Also, the first and second shielding members may optionally cooperate to form, at least in part, a fluid tight enclosure to facilitate liquid cooling of the circuit. In such a case, the arrangement of the present invention both provides EM shielding and facilitates liquid cooling, thereby allowing for operation of a high frequency, high speed (and thus heat generating) circuit.

An exemplary method according to the present invention includes a method of manufacturing electromagnetic shielding for a circuit carrying substrate, the circuit carrying substrate carrying a circuit comprising a plurality of separately mounted circuit elements. The method includes a step of disposing a first shielding member having first and second dimensions exceeding first and second dimensions defined by the circuit on a first side of the circuit. The method further includes a step of disposing a plurality of shielding connectors around a periphery of the circuit, each of the plurality of shielding connectors being electrically conductive and extending between the first shielding member and a second side of the circuit, the plurality of shielding connectors spaced apart by a distance that is less than one-fourth the wavelength of an effective operating frequency of the circuit. The method also includes the step of securing a second shielding member to the first shielding member to enclose the circuit, the second shielding member having first and second dimensions exceeding first and second dimensions defined by the circuit and being disposed on a second side of the circuit. The second shielding member is secured to the first shielding member, such that the second shielding member contacts the plurality of shielding connectors and causes plastic deformation of at least some of the plurality of shielding connectors.

The above described features and advantages, as well as others, will become more readily apparent to those of ordinary skill in the art by reference to the following detailed description and accompanying drawings.

DETAILED DESCRIPTION

Figure 1:
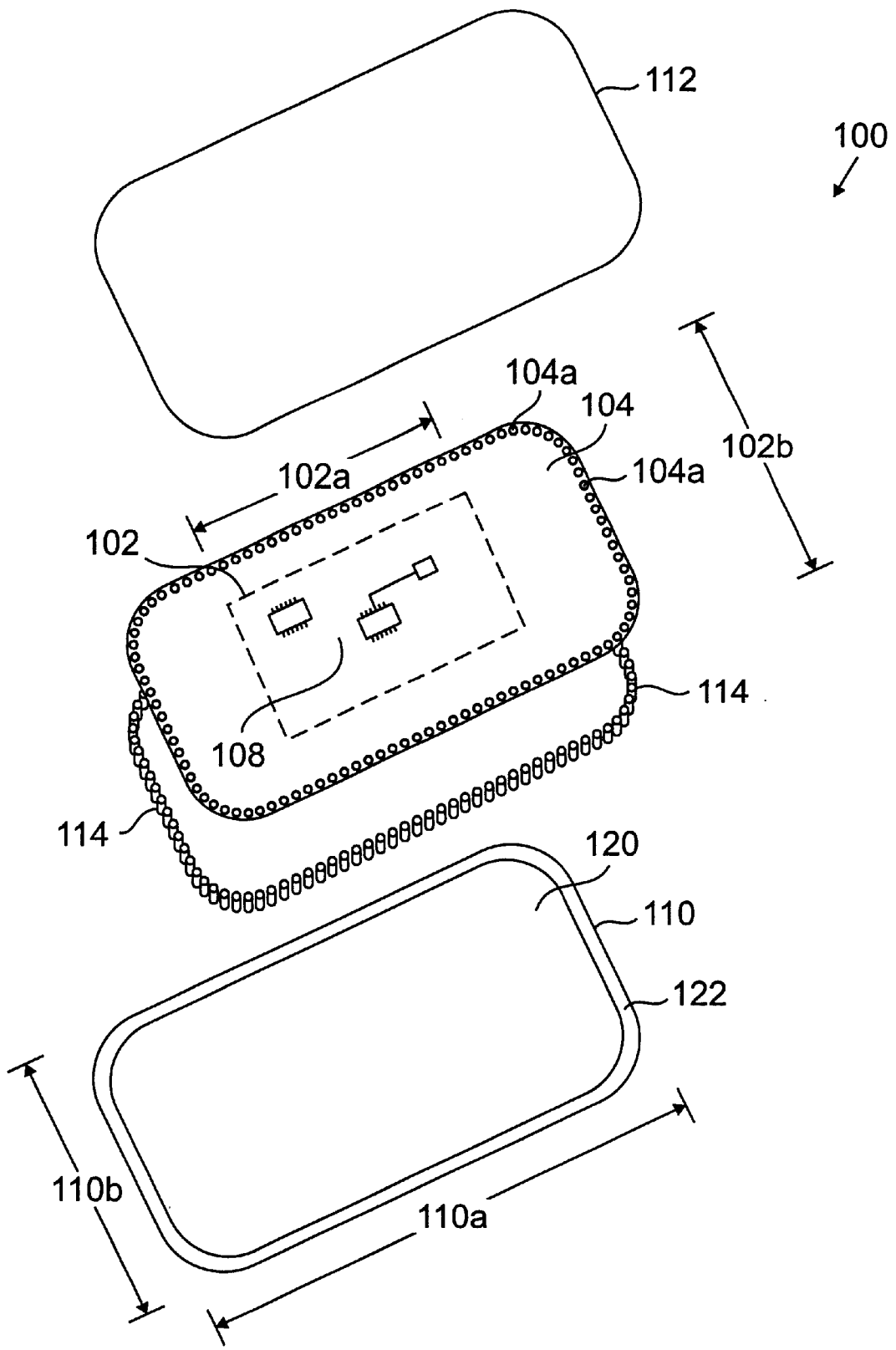
FIG. 1 shows an exploded perspective view of an exemplary embodiment of an arrangement for electromagnetically shielding a circuit disposed on a circuit carrying substrate in accordance with the present invention.
Figure 2:
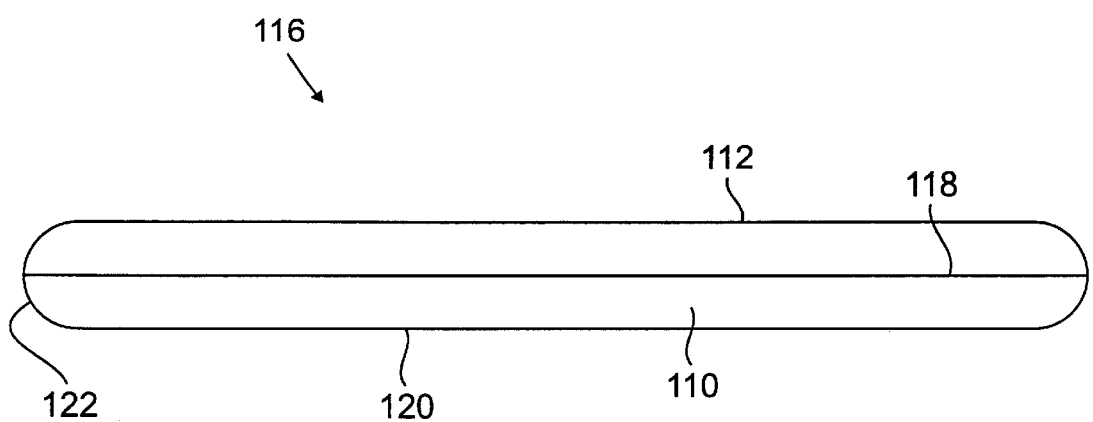
FIG. 2 shows a side view of the arrangement of FIG. 1.
Figure 3:
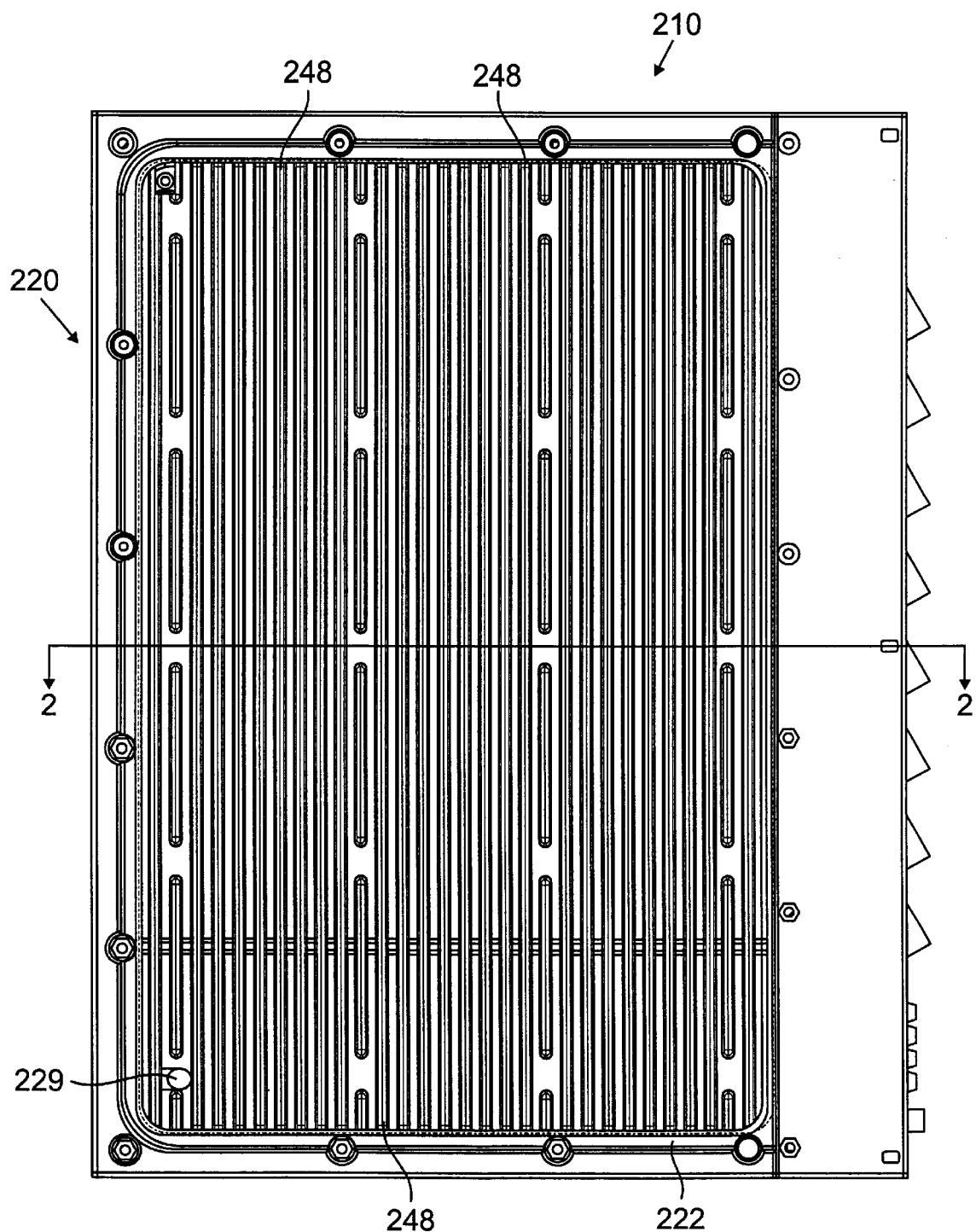
FIG. 3 shows a side elevational view of a second exemplary embodiment of an arrangement for electromagnetically shielding a circuit in accordance with the present invention.

FIGS. 1 and 2 show an arrangement 100 for electromagnetically shielding a circuit 102 disposed on a circuit carrying substrate 104. The circuit 102 comprises a plurality of separately mounted circuit elements 106. The circuit 102 in the exemplary embodiment described herein includes a high speed cross connect used in a communication network, not shown. The high speed cross connect has a bit rate of on the order of 600 MHz. The 600 MHz bit rate generates higher frequency EM radiation in significant levels at 3.5 GHz. By significant levels, it is meant that the EM radiation at energy at that frequency and higher would be unacceptable under industry, government or internal standards. The circuit carrying substrate 104 may suitably be a printed circuit board having a plurality of integrally formed traces 108 located thereon and therein.

The arrangement 100 includes a first shielding member 110, a second shielding member 112, and a plurality of plastically deformable shielding connectors 114. The first shielding member 110 has first and second dimensions 110a and 110b exceeding first and second dimensions 102a and 102b defined by the circuit 102. The first shielding member 110 is disposed on a first side of the circuit. The first shielding member 110 is constructed of an electrically conductive material, such as aluminum.

In a preferred embodiment, the first shielding member 110 includes a substantially planar portion 120 having first and second dimensions exceeding the first and second dimensions 102a and 102b of the circuit 102, and a peripheral portion 122 extending from said planar portion 120. The peripheral portion 122 and the planar portion 120 cooperate to define a cavity having first and second dimensions exceeding the first and second dimensions of the circuit 102.

The second shielding member 112, like the first shielding member 110, has first and second dimensions exceeding the first and second dimensions defined by the circuit 102, and is preferably constructed of aluminum. The second shielding member 112 is disposed on a second side of the circuit 102 such that the first and second shielding members 110, 112 define an enclosure 116. The enclosure 116 includes a seam or slot 118 defined by the intersection of the first and second shielding members 110, 112.

The second shielding member 112 may furthermore comprise a structure analogous to that described above in connection with the preferred embodiment of the first shielding member 110. In alternative embodiments, it will be noted that one of the shielding members 110 and 112, and preferably the one that is on the underside of the circuit 102, may suitably be a ground plane that is integrally formed with the circuit carrying substrate 104.

Each of the plurality of shielding connectors 114 is electrically conductive and extends between the first shielding member 110 and the second shielding member 112. The plurality of shielding connectors 114 are disposed within and throughout the slot 118 (not shown in FIG. 2) and spaced apart by a distance that is less than one-fourth the wavelength of an effective operating frequency of the circuit. In other words, the plurality of shielding connectors 114 are disposed such that the distance between any two adjacent shielding connectors 114 is less than one-fourth the wavelength of the effective operating frequency, and the distance between any end of the slot 118 and one or more shielding conductors is less than one-fourth the wavelength of the effective operating frequency.

The effective operating frequency of the circuit 102 is the frequency at and below which it is desirable to shield EM radiation. The effective operating frequency may suitably be the highest frequency at which unacceptable EM radiation is present. Consider an example in which the circuit 102 produces unacceptable EM radiation levels at 3.5 GHz, but produces tolerable EM radiation levels at higher frequencies. In such a case, the effective operating frequency of the circuit would be considered to be 3.5 GHz. The wavelength associated with 3.5 GHz is determined by the equation c/f, where c is the speed of light. Thus, the wavelength associated with the effective operating frequency of 3.5 GHz is approximately 84 mm. In such a case, the plurality of shielding connectors should be spaced apart by a distance of less than 21 mm.

It will be noted that the effective operating frequency of the circuit 102 depends upon both the highest bit rate handled by the circuit 102 and other factors. The determination of the effective operating frequency of any circuit may be readily determined empirically. In particular, a test procedure may be used to determine the highest frequency for which shielding is required for a particular circuit. This procedure includes first operating the circuit 102 in an unshielded environment and performing spectral analysis on the emitted EM radiation. Review of the spectral analysis identifies the frequencies for which EM radiation shielding is necessary. The highest of such frequencies is the effective operating frequency of the circuit 102. Other methods of determining the effective operating frequency may be used, including theoretical determinations and other empirical procedures.

The above described invention thus provides an enclosure that is easier and less expensive to manufacture than enclosures that utilize elastic springs as shielding connectors. In particular, plastically deformable material, such as solder, is less expensive and easier to manipulate. An exemplary method of manufacturing the arrangement 100 of FIGS. 1 and 2 is described herebelow.

The exemplary method of manufacturing the electromagnetic shielding arrangement 100 involves first disposing the first shielding member 110 on a first side of, in other words, below, the circuit 102.

Once the first shielding member 110 disposed below the circuit 102, the plurality of shielding connectors 114 are disposed around a periphery of the circuit such that each of the plurality of shielding connectors extends between the first shielding member 110 and the second shielding member 112 when the second shielding member 112 is secured thereto. As discussed above, the plurality of shielding connectors 114 must be spaced apart by a distance that is less than one-fourth the wavelength of an effective operating frequency of the circuit.

In the embodiment described herein, the circuit carrying substrate 104 is prefabricated with a plurality of openings 104a corresponding to the placement of the shielding connectors 114. Solder is then applied to the openings to create the shielding connectors 114. Relying upon the surface tension of the solder, the solder is applied such that raised bumps of solder appear on either side of the circuit carrying substrate 104. The solder application may suitably occur during the performance of automated soldering operations ordinarily used in the assembly of the circuit 102 on the circuit carrying substrate 104.

In any event, the next step is to secure the second shielding member 112 to the first shielding member 110 to enclose the circuit 102. To this end, the second shielding member 112 may be bolted or otherwise mechanically fastened to the first shielding member 110 either directly or through the circuit carrying substrate 104. While the second shielding member 112 is being secured to the first shielding member 110, opposing surfaces of the first shielding member 110 and second shielding member 112 begin to engage one or more of the shielding connectors 114. As the securing continues, the first engaged shielding connectors 114 begin to plastically deform, thereby allow the opposing surfaces of the first and second shielding members 110 and 112 to engage more of the shielding connectors 114. Preferably, when the securing step is complete, all of the shielding connectors 114 are in electrical contact with both the first and second shielding members.

It is noted that the use of plastically deformable material helps ensure contact between all the shielding connectors 114 and the first and second shielding members 110 and 112. While the prior art system of using springs as shielding connectors accomplishes the same purpose, springs are more complicated to install and incur higher material costs. By contrast, if solder is used as the plastically deformable shielding connectors 114, and the shielding connectors 114 are disposed in openings in the circuit carrying substrate 104, then the shielding connectors 114 may suitably be generated using the automated solder methods used to solder the circuit components to the circuit carrying substrate 104.

A further aspect of the present invention is the ability to use an enclosure structure intended for other purposes as the first and second shielding members 110 and 112. FIGS. 3 through 7, discussed below, show an arrangement for enclosing a fluid in at least a first portion of a circuit in which the enclosure member. That enclosure member is comprised of two plate members and associated structures that function as the first and second shielding members similar to the first and second shielding members 110 and 112 of FIGS. 1 and 2.

FIGS. 3, 4, 5, 6, and 7 show an arrangement 210 for cooling an electronic assembly 212 which incorporates the EM shielding features of the present invention. The arrangement 210 includes an enclosure member 220 and a circuit carrying substrate or circuit board 214. The arrangement 210 also includes a plurality of electronic components attached to the circuit board 214. This plurality of electronic components includes switching devices, power management devices, filter devices, memory devices, and processor devices. However, hereinafter, only a first electronic component 230 and a second electronic component 234 will be discussed in detail for clarity of description. The arrangement 210 further includes a fluid 232, a gas 236, a first sealing member 238, and a second sealing member 240.

The enclosure member 220 includes a first plate member 222, a second plate member 224, a plurality of fins 248, first and second wall segments 242 and 244, at least one sealing member channel 268 and at least one set of contact surfaces 269. The plurality of fins 248 extend perpendicularly from each of the first and second plate members 222 and 224. The first wall segment 242 extends from one edge of the plate member 222 and the second wall segment 244 extends from the second plate member 224. The sealing member channel 268 is disposed at the periphery of the first plate member 222, and is in part disposed between the first plate member 222 and the first wall segment 242. In a substantially identical manner, a sealing member channel (not shown) is also disposed at the periphery of the second plate member 24.

The set of contact surfaces 269 extends angularly from the periphery of the first plate member 222 and define surfaces on either side of the sealing member channel 268. In a substantially identical manner, a corresponding set of contact surfaces, not shown, extends angularly from the periphery of the second plate member 224.

The first plate member 222, the sealing member channel 268, the set of contact surfaces 269, the fins 248, and the first wall segment 242, are preferably all integrally formed of a single piece of conductive material and, as a group, constitute a first shielding member having properties similar to the first shielding member 110 of FIGS. 1 and 2. Likewise, the second plate member 224, the corresponding sealing member channel, set of contact surfaces, the fins 248, and the second wall segment 244 are integrally formed of conductive material and together constitute a second shielding member having properties similar to the second shielding member 112 of FIGS. 1 and 2.

The circuit board 214 includes a primary circuit board portion 216 and a secondary circuit board portion 218 integrally secured to the primary circuit board portion 216. The circuit board 214 also has a first surface 258 and an opposing second surface 260 defined thereon. The primary circuit board portion 216 includes at its periphery a sealing member location 264 defined on first surface 258. Adjacent the sealing member location 264 at the periphery of the primary circuit board portion 216 are a plurality of shielding connectors 265. The plurality of shielding connectors 265 in the embodiment described herein are a plurality of solder rivets that extend from the first surface 258 to the second surface 260. Each of the plurality of solder rivets or shielding connectors 265 extends slightly upward from each of the first surface 258 and the second surface 260. The plurality of shielding connectors 265 are positioned around the entire periphery of the primary circuit board portion 216 and are spaced apart by a distance less than one-fourth the effective operating frequency of the circuit located in the primary circuit board portion 216.

The primary circuit board portion 216 also has a sealing member location (not shown) defined on the second surface 260 which is substantially identical to the sealing member location 264. As shown more clearly in FIG. 6, a segment 266 of the sealing member location 264 is interposed between the primary circuit board portion 216 and the secondary circuit board portion 218. In a similar manner, a segment (not shown) of the sealing member location (not shown) defined on the second surface 260 is interposed between the primary circuit board portion 216 and the secondary circuit board portion 218.

The first electronic component 230 is an electronic device that generates heat during operation and may be liquid cooled. Such devices are known. The second electronic component 234 is a device that is not amenable to liquid cooling, such as, for example, an optical transmitter. The first electronic component 230 is secured to the primary circuit board portion 216 such that the first electronic component 230 is located on the first surface 258 of the circuit board 214. In any event, the second electronic component 234 is similarly secured to the secondary circuit board portion 218 such that the second electronic component 234 is also located on the first surface 258 of the circuit board 214.

Figure 4:
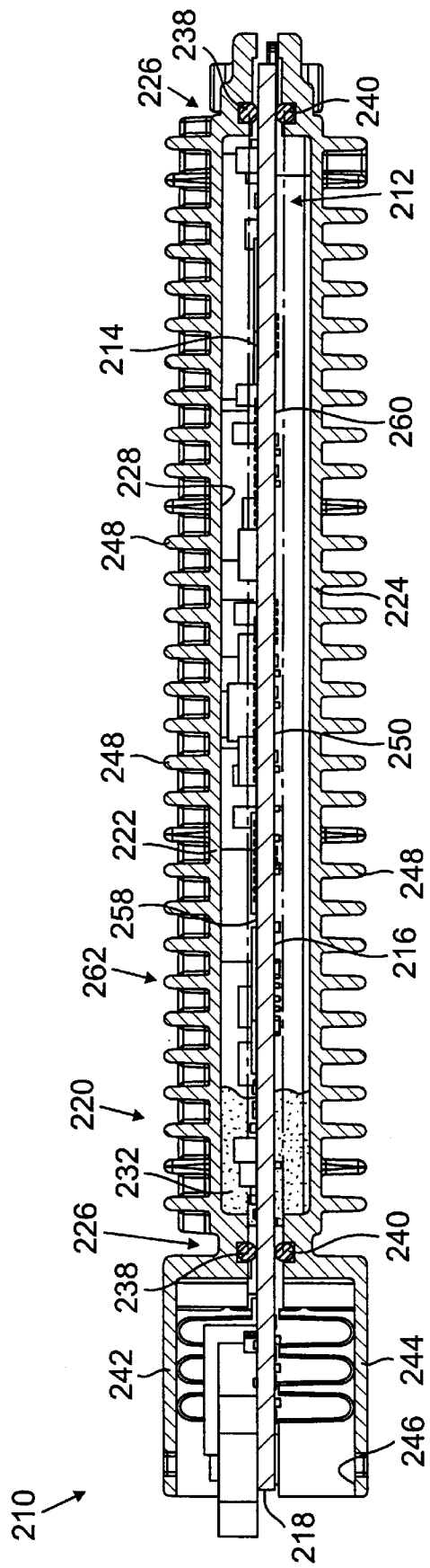
FIG. 4 is a cross sectional view of the arrangement of FIG. 3 taken along the line 2—2 as viewed in the direction of the arrows.
Figure 6:
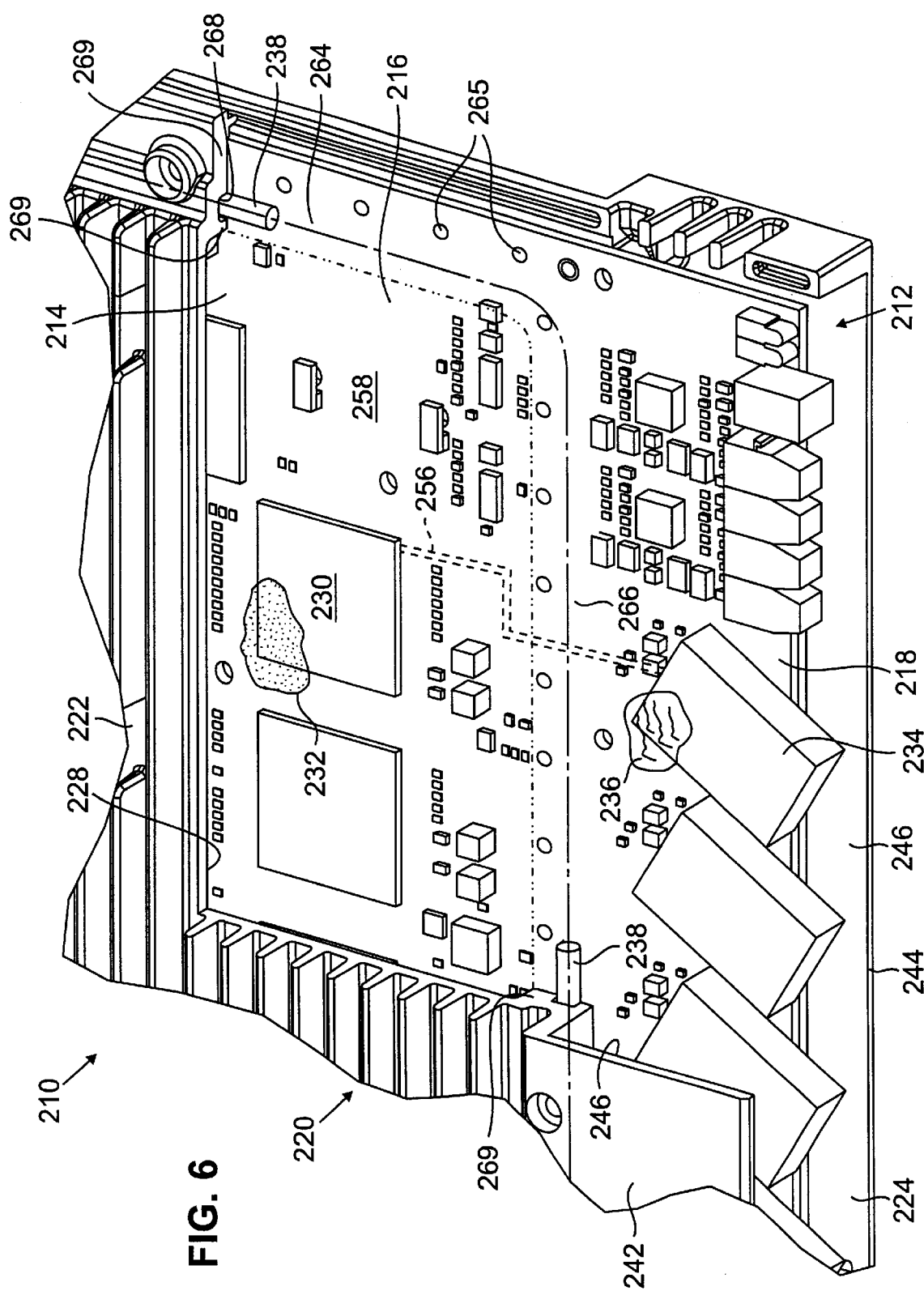
FIG. 6 is an enlarged view of a portion of FIG. 5.
Figure 7:
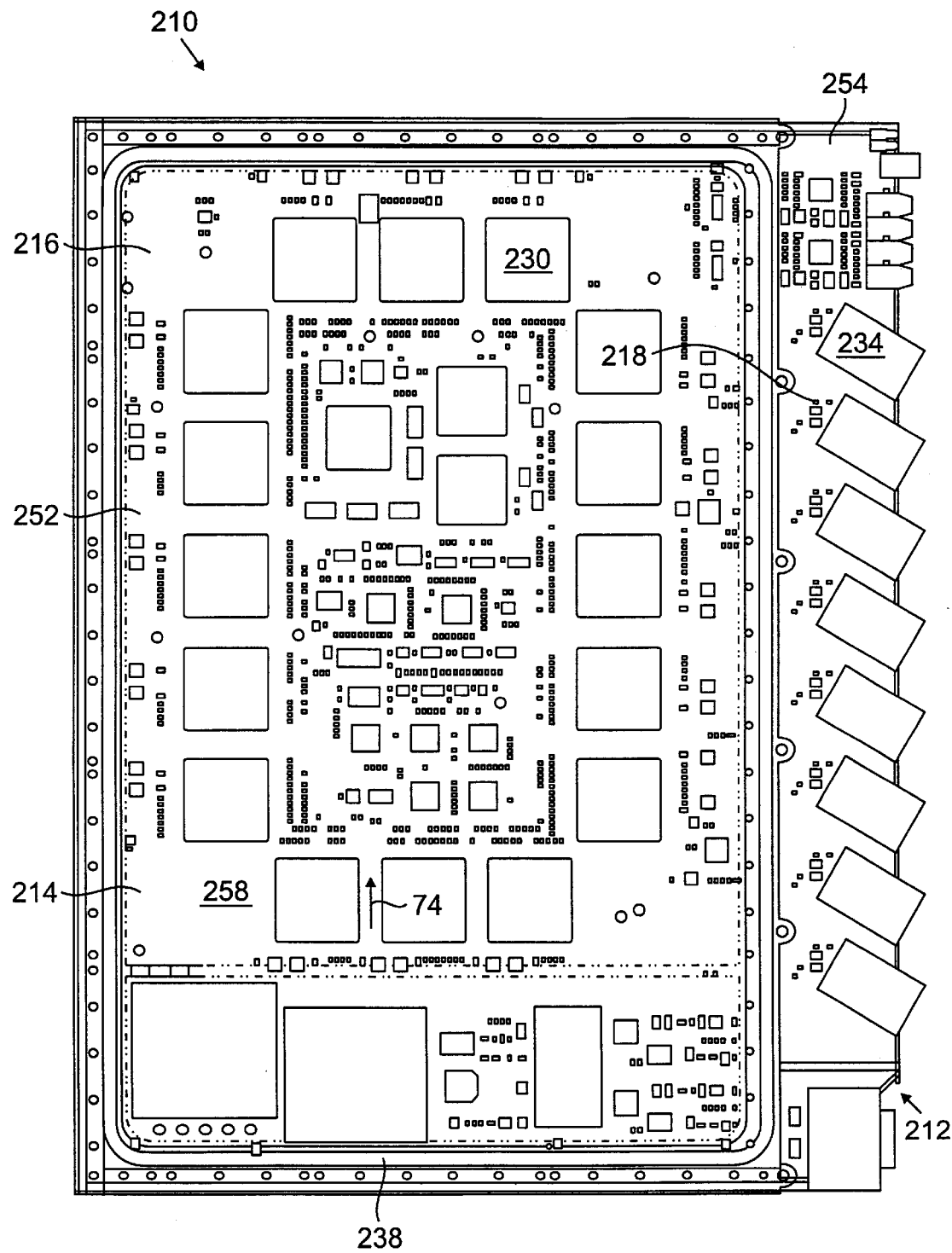
FIG. 7 is a view similar to the one shown in FIG. 3, but showing the first enclosure member removed for clarity of description.

As shown more clearly in FIGS. 4 and 6, the first sealing member 238 is positioned on the sealing member location 264 of the primary circuit board portion 216. The first plate member 222 is then positioned relative to the circuit board 214 such that the first sealing member 238 is (i) positioned within the sealing member channel 268 and (ii) interposed between the primary circuit board portion 216 and the first plate member 222. The first sealing member 238 may suitably be a rubber gasket having a circular cross section when uncompressed.

The second sealing member 240 is substantially identical to the first sealing member 238. The second sealing member 240 is positioned on the sealing member location (not shown) defined on the second surface 260 in a similar manner as that described above for the first sealing member 238. The second plate member 224 is then positioned relative to the circuit board 214 such that the second sealing member 240 is (i) positioned within the sealing member channel defined in the second plate member 224 and (ii) interposed between the primary circuit board portion 216 and the second plate member 224.

Once the first plate member 222, the first sealing member 238, the circuit board 214, the second sealing member 240, and the second plate member 224 are positioned in the above described manner, the first plate member 222 and the second plate member 224 are secured together and to the circuit board 214 via a number of fasteners (e.g., screws) inserted through holes defined in the first plate member 222, the second plate member 224, and the circuit board 214. When the first plate member 222 is secured to the second plate member 224, at least some of the contact surfaces 269 extending from the first plate member 222 and the corresponding contact surfaces extending from the second plate member 224 contact and converge upon the plurality of shielding connectors 265. As a result, each of the plurality of shielding connectors 265 is in electrical contact with the first plate member 222 and the second plate member 224.

It should be understood that positioning and securing the first plate member 222, the first sealing member 238, the circuit board 214, the second sealing member 240, and the second plate member 224 in the above described manner results in the enclosure member 220 and the primary circuit board portion 216 cooperating so as to create a fluid tight barrier 226 of a compartment 228. In particular, the first plate member 222, the first sealing member 238, the primary circuit board portion 216, the second sealing member 240, and the second plate member 224 cooperate to create the fluid tight barrier 226 of the compartment 228.

In addition, the first plate member 222, the second plate member 224, the contact surfaces 269, the corresponding contact surfaces extending from the second plate member 224, and the plurality of shielding connectors 265 form an EM shield that inhibits EM radiation from the circuit components located in the primary circuit board portion 216.

It should also be appreciated that, since the first electronic component 230 is secured to the primary circuit board portion 216, the first electronic component 230 is also located within the compartment 228. It should further be appreciated that the above described arrangement locates the secondary circuit board portion 218 outside of the compartment 228. Because the second electronic component 234 is secured to the secondary circuit board portion 218, the second electronic component 234 is also located outside of the compartment 228.

In accordance with one aspect of the present invention, the first electronic component 230 is electrically coupled to the second electronic component 234 via at least one conductive trace 256. The trace 256 has one end coupled to the first electronic component, another end coupled to the second electronic component 234, and a middle portion that extends therebetween. The middle portion of the trace 256 is interposed between the first surface 258 and the second surface 260 of the circuit board 214 while each end of trace 256 extends through first surface 258 so as to be electrically interfaced either directly or indirectly with the first electronic component 230 and the second electronic component 234.

It should be appreciated that while only the first electronic component 230 and the second electronic component 234 are shown electrically coupled via a trace interposed between the first surface 258 and the second surface 260 of the circuit board 214, several of the electronic components located within the compartment 228 may be electrically coupled to electronic components located outside of the compartment 228 (i.e., on secondary circuit board portion 218) utilizing similar traces interposed between the first surface 258 and the second surface 260 of the circuit board 214.

It will further be noted that the trace 256 must also pass through the periphery of the primary circuit board portion 216 as defined by the plurality of shielding connectors 265. As a result, a portion of the trace 256 is not EM shielded by the enclosure member 220 and the plurality of shielding connectors 265. To provide adequate EM shielding for that portion of the trace 256, the trace 256 passes through first and second ground planes, not shown, formed within the circuit board 214. In particular, it is known to provide ground plane layers within a circuit board. In the embodiment described herein, at least the second circuit board portion 218, and typically the entire circuit board 214, includes two parallel ground planes formed therein. By passing the portion of the trace 256 that is external to the primary circuit board portion 216 between the ground planes, EM radiation from that trace will be inhibited. The trace 256 exits the second circuit board portion 218, and thus exits the two parallel ground planes, proximate the second electronic component 234. At that point, too little of the trace 256 is exposed to create any significant external EM radiation.

It will be noted that the circuit elements on the secondary circuit board portion 218 do not benefit from the shielding of the enclosure member 220 and the shielding connectors 265. However, it is contemplated that far less circuit elements will be located in the secondary circuit board portion 218 and thus EM radiation from the secondary circuit board portion 218 will present far less problems. In particular, it is desirable to maximize the number of circuit elements that are liquid cooled and thus located within the container 228. Because only a relatively small amount of circuit elements are not amenable to liquid cooling, and those elements are often optical elements, it is most likely that a substantial majority of the EM radiating circuit elements will be located within the container 228. Accordingly, EM radiation from elements in the secondary circuit board portion 218 will be relatively moderate, and may be controlled using conventional techniques including additional shielding, controlling the size of leads, and/or placement of traces between ground planes in the circuit board 214.

Figure 5:
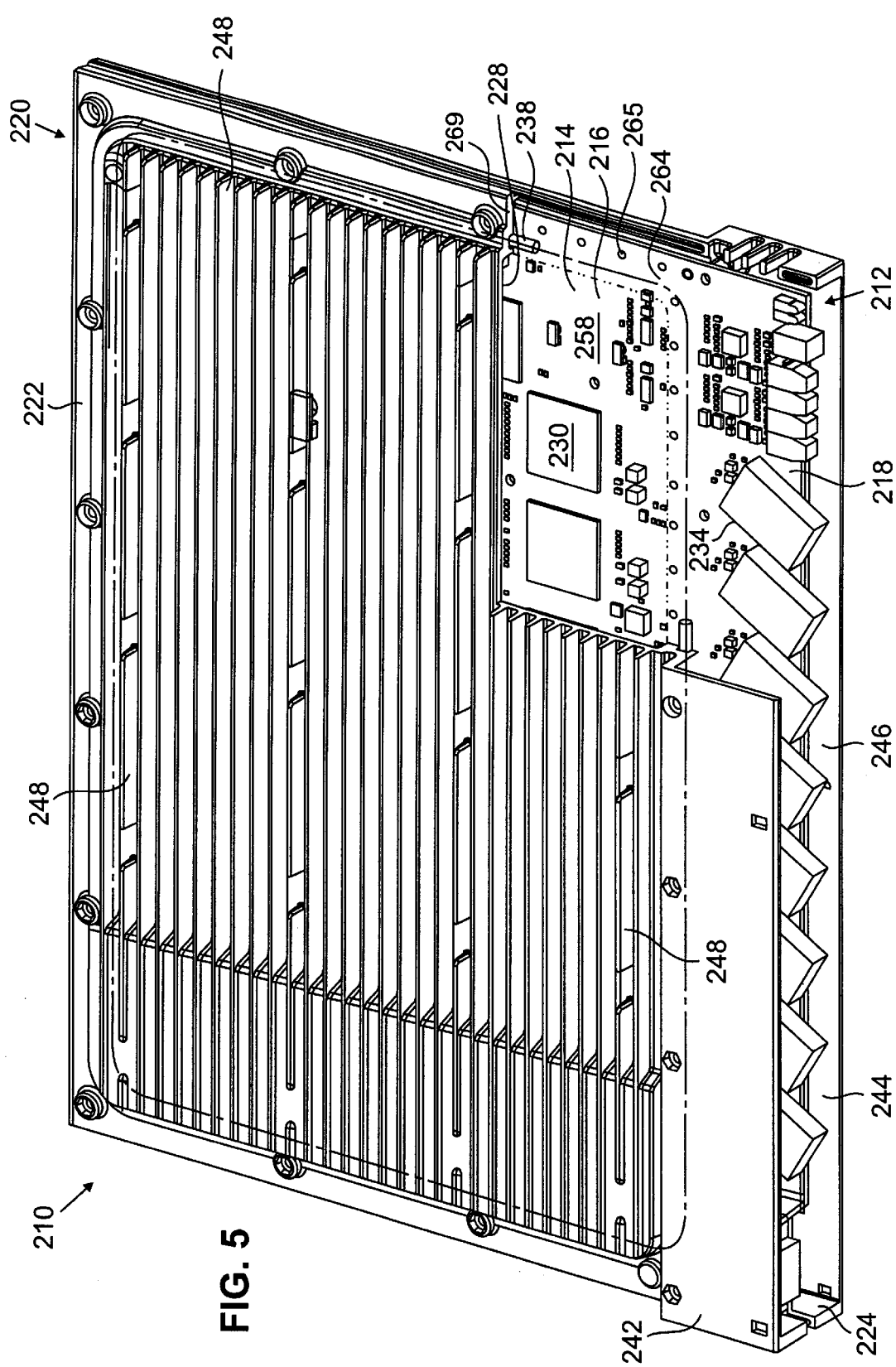
FIG. 5 is a perspective fragmentary view of the arrangement of FIG. 3.

Attaching the first plate member 222 and the second plate member 224 to each other as previously described also results in the first wall segment 242 and the second wall segment 244 cooperating so as to define a cavity 246 as clearly shown in FIGS. 4, 5, and 6. The secondary circuit board portion 218 is positioned within cavity 246. Moreover, since the second electronic component 234 is attached to the secondary circuit board portion 218, the second electronic component 234 is also positioned within the cavity 246.

As shown in FIGS. 4 and 6, a liquid 232 is disposed within the compartment 228 through an aperture (not shown) defined in the first plate member 222. Preferably, the liquid 232 is disposed within the compartment 228 such that the liquid 232 is in direct contact with all of the electronic components secured to the primary circuit board portion 216. To this end, the enclosure member 220 includes a rotatably insertable fluid stop 229 that fits into the aperture in the first plate member 222. After the first plate member 222 and the second plate member 224 are secured to each other as described above, the liquid 232 is disposed into the compartment 228 through the aperture. The fluid stop 229 is then secured into the aperture to enclose the liquid 232 in the compartment 228.

As shown in FIG. 6, the liquid 232 is preferably in direct contact with the first electronic component 230. Preferably, the liquid 32 may suitably be a cooling fluorocarbon liquid, such as the commercially available product Fluorinert FC-77, which is available from Minnesota Mining & Manufacturing, Inc.

As also depicted in FIG. 6, the cavity 246 allows a gas 236, such as air, to come into direct contact with the electronic components (e.g., second electronic component 234) attached to the secondary circuit board portion 218.

It should be understood that the compartment 228 is fluid tight. Therefore, the compartment 228 prevents the liquid 232 from entering the cavity 246 and coming into contact with any of the electronic components attached to the secondary circuit board portion 218 (e.g., the second electronic component 234). In particular, the fluid tight barrier 226 prevents the liquid 232 from contacting any of the electronic components attached to the secondary circuit board portion 218. Therefore, it should be appreciated that the electronic components attached to the circuit board 214 are segregated into two separate environments. Specifically, the electronic components secured to the primary circuit board portion 216 (e.g., first electronic component 230) of the circuit board 214 are bathed in a liquid environment provided by the liquid 232. On the other hand, the electronic components secured to the secondary circuit board portion 218 (e.g., second electronic component 234) are located in a gaseous environment, i.e., the air.

During use of the arrangement 210, the electronic components attached to the circuit board 214 generate a significant amount of heat. However, this heat is effectively managed by the advantageous design features of the present invention. In general, the liquid 232 transfers heat from the electronic components towards the enclosure member 220. The enclosure member 220, which is preferably constructed of a heat conducting material such as aluminum, conducts heat to the fins 246 thereon. The fins 246 provide a substantial amount of surface area for the heat to dissipate.

The above describe embodiment of the present invention thus provides an enclosure member 220 that both provides a fluid tight compartment for at least a portion of the circuit board 214 as well as forming a part of an EM shielding arrangement. In the particular embodiment described herein, the enclosure member 220 furthermore cooperates with the circuit board 214 to form the fluid tight compartment which allows circuit connections between the compartment 228 and external devices without the use of insulated feedthroughs, which degrade circuit performance and are prone to liquid leakage. Instead, such circuit connections are carried out by passing conductive traces through the circuit board 214 itself.

In addition, the EM shielding arrangement of the embodiment described above facilitates the use of a circuit that incorporates both liquid cooled and air cooled elements. In particular, the enclosure member 220 and the shielding connectors 265 provide substantial EM shielding to the circuit elements in the primary circuit board portion 216, which typically will contain the vast majority of EM radiating circuit elements. The EM radiation of circuit elements in the secondary circuit board portion 218, which will typically be far less substantial, may be controlled using conventional ground plane techniques and lead length control. The present invention furthermore facilitates communication of signals from the EM enclosure formed by the enclosure member 220 and the shielding connectors 265 to external devices directly through the circuit board 214 via conductive traces, which eliminates the need for terminations and connectors at the barrier of the EM enclosure that can degrade circuit performance.

Furthermore, the above described embodiment of the present invention may be used to segregate components causing relatively large EM radiation from components that are particularly EM radiation sensitive. For example, the components causing relatively large EM radiation may be located in the enclosed primary circuit board portion 216 while the EM sensitive components may be located in the secondary circuit board portion 218.

It will be appreciated that the above described embodiments are merely illustrative, and that those of ordinary skill in the art may readily devise their own implementations that incorporate the principles of the present invention and fall within the spirit an scope thereof.

For example, the arrangement 100 of the present invention (and variants thereof) may be used to protect the circuit 102 from externally generated EM radiation instead of reducing EM energy radiated by the circuit 102. In such a case, the "effective operating frequency"of the circuit 102 becomes the highest problematic frequency which the circuit 102 is exposed to during normal operation. For example, if the circuit 102 is used in an environment where normal operating conditions expose the circuit 102 to harmful levels of EM radiation at 3.5 GHz, the effective operating frequency of the circuit 102 may be 3.5 GHz. The arrangement 100 may otherwise be constructed as described above.

We claim:

1. An arrangement for enclosing at least a portion of a circuit carrying substrate, the circuit carrying substrate carrying a circuit comprising one or more separately mounted circuit elements, the arrangement comprising:
   a) a first shielding member having first and second dimensions exceeding first and second dimensions defined by the circuit, the first shielding member disposed adjacent to a first side of the circuit;
   b) a second shielding member having first and second dimensions exceeding first and second dimensions defined by the circuit, the second shielding member disposed adjacent to a second side of the circuit, the first and second shielding members cooperating to define at least in part a fluid tight container for enclosing the circuit, the first and second shielding members further defining a slot therebetween;
   c) a plurality of shielding connectors, each of the plurality of shielding connectors being electrically conductive and extending between the first shielding member and the second shielding member, the plurality of shielding connectors disposed within and throughout said slot and spaced apart by a distance that is less than one-fourth the wavelength of an effective operating frequency of the circuit.

2. The arrangement of claim 1 wherein the first and second shielding members further cooperate with the circuit carrying substrate to form the fluid tight container.

3. The arrangement of claim 2 further comprising a fluid disposed within the fluid tight container.

4. The arrangement of claim 2 wherein the circuit carrying substrate further comprises a primary circuit board portion located within the container and a secondary circuit board portion located outside the container, and further comprises a conductor extending from one or more of the plurality of separately mounted circuit elements through the slot to one or more circuit elements located on the secondary circuit board portion.

5. The arrangement of claim 4 further comprising first and second ground planes integrally formed with at least a portion of said circuit carrying substrate, the first and second ground planes extending in parallel planar manner, and wherein a portion of the conductor located outside the container is disposed between said first and second ground planes.

6. The arrangement of claim 1 further including a conductor extending from one or more of the plurality of separately mounted circuit elements through the slot to allow connection to devices external to the container.

7. The arrangement of claim 1 wherein at least one of the plurality of shielding connectors comprises a solder rivet.

8. The arrangement of claim 7 wherein each of said plurality of shielding connectors comprises a solder rivet.

9. The arrangement of claim 8 wherein said at least one solder rivet extends through said circuit carrying substrate.

* * * * *